United States Patent [19]
Komoto

[11] Patent Number: 5,289,082
[45] Date of Patent: Feb. 22, 1994

[54] LED LAMP

[75] Inventor: Satoshi Komoto, Tokyo, Japan

[73] Assignee: Kabushiki Kaisha Toshiba, Kawasaki, Japan

[21] Appl. No.: 755,841

[22] Filed: Sep. 6, 1991

[30] Foreign Application Priority Data

Sep. 7, 1990 [JP] Japan .................................. 2-237649

[51] Int. Cl.⁵ ......................... H01L 33/00; G02B 3/04
[52] U.S. Cl. .................................... 313/500; 313/512; 362/800
[58] Field of Search ................. 313/500, 512; 362/800

[56] References Cited
U.S. PATENT DOCUMENTS 4,185,891  1/1980  Kaestner .......................... 313/500 X
5,013,144  5/1991  Silvergate et al. ............. 362/800 X

OTHER PUBLICATIONS

Vol. 8-20; 90-5676, Apr. 11, 1990; "Led Lamp" by Satoshi Kamoto.

Primary Examiner—Sandra L. O'Shea
Attorney, Agent, or Firm—Oblon, Spivak, McClelland, Maier & Neustadt

[57] ABSTRACT

A LED lamp having a lead, a plurality of semiconductor chips placed on a tip portion of the lead, a translucent envelope surrounding the semiconductor chips, characterized in that the envelope is formed of a solid body containing parts of a plurality of ellipsoids or spheres whose axes extend through the semiconductor chips, respectively.

5 Claims, 10 Drawing Sheets

LED LAMP

BACKGROUND OF THE INVENTION

1. Field of the Invention

This invention relates to an LED lamp having an envelope of an improved shape.

2. Description of the Related Art

FIG. 1 shows the envelope of a conventional LED lamp having more than two semiconductor chips. In the figure, reference numeral 1 denotes semiconductor chips, reference numeral 2 leads, reference numeral 3 bonding wires, reference numeral 4 an envelope made of a translucent resin and having a spherical portion denoted by reference numeral 5, and reference numeral 6 the axis of the envelope.

As is shown in FIG. 1, the envelope 4 can be divided mainly into an upper portion and a lower portion. The upper portion has, for example, a single curved surface which is formed of part of a spheroid or sphere having a rotational axis which coincides with the axis 6. The lower portion is cylindrical and coaxial with the upper portion. The curved surface serves as the lens of the LED lamp.

With this structure, however, all the semiconductor chips cannot be located on the focus of the lens. Thus, as is shown in FIG. 4, the light beams emitted from the lamp are inevitably separated from each other.

SUMMARY OF THE INVENTION

It is the object of the invention to enable an LED lamp having a plurality of semiconductor chips to effectively emit light toward its front portion of the lamp.

To attain the object, according to an aspect of the invention, an LED lamp has a lead, a plurality of semiconductor chips placed on a tip portion of the lead, a translucent envelope surrounding the semiconductor chips, characterized in that the envelope is formed of a solid body containing parts of a plurality of ellipsoids or spheres whose axes extend through the semiconductor chips, respectively.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

The invention will be described in detail with reference to the accompanying drawings showing embodiments thereof.

Figure 1:
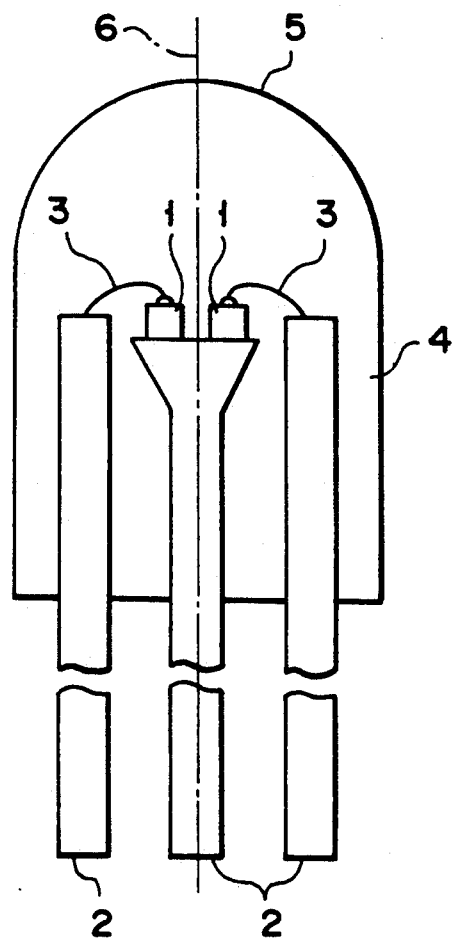
FIG. 1 is a sectional view of a conventional LED lamp.
Figure 2:
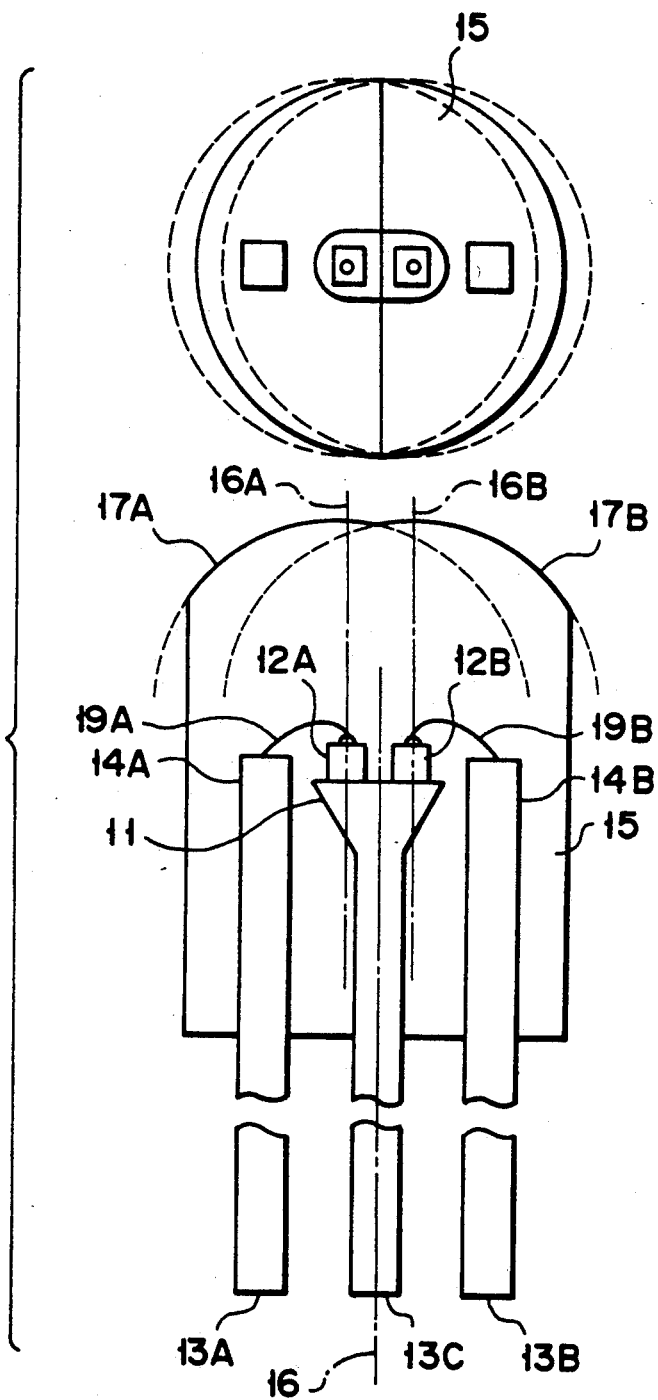
FIG. 2 is a view showing an LED lamp according to an embodiment of the present invention.

FIG. 2 shows an LED lamp according to an embodiment. A chip-mounting portion 11 for mounting chips thereon is formed on the tip of a lead 13C. Semiconductor chips 12A and 12B are placed on the chip-mounting portion 11. Bonding portions 14A and 14B are formed at the tips of leads 13A and 13B, respectively. A bonding wire (made of e.g. gold) 19A has an end connected to the semiconductor chip 12A, and the other end connected to the bonding portion 14A. A bonding wire 19B has an end connected to the semiconductor chip 12B, and the other end connected to the bonding portion 14B. The tips of the leads 13A - 13C are sealed with an envelope 15 made of epoxy resin.

The envelope 15 has an upper portion and a lower portion. The lower portion is cylindrical and has an axis 16, as in the conventional LED lamp. The invention is characterized by the configuration of the upper portion, which will be explained in detail hereinbelow.

The upper portion consists of two curved surfaces. One 17A of the curved surfaces is formed of part of an spheroid or sphere having a rotational axis 16A extending through the chip 12A and being parallel with the lead 13C. The other curved surface 17B is formed of part of a spheroid or sphere having a rotational axis 16B extending through the chip 12B and being parallel ,with the lead 13C. The curved surface 17A serves as a lens for passing light, emitted from the semiconductor chip 12A, to the outside of the LED lamp, while the curved surface 17B serves as a lens for passing light, emitted from the semiconductor chip 12B, to the outside of the LED lamp.

In this connection, the ellipsoids containing spheroids, which the invention is applied to, can be expressed by $$[x/a]^2 + [y/b]^2 + [z/c]^2 = 1 \qquad (1)$$

where one of x, y, z corresponds to the axis (16A or 16B) of each of the ellipsoids.

Since the curved surfaces are formed aligned with the chips 12A and 12B, respectively, light can be effectively emitted from the chips to the outside of the lamp through the curved surfaces. Further, since the lower portion is cylindrical, the light emitted to the outside of the lamp forms a circular spot which looks fine.

Figure 4:
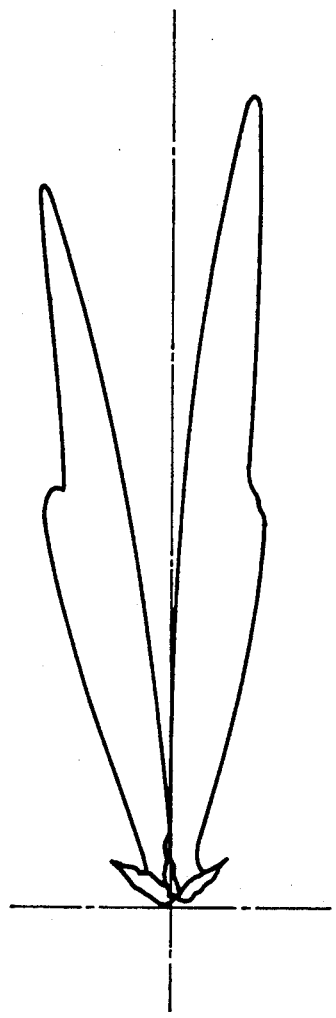
FIG. 4 is a view showing the light distribution characteristic of the LED lamp of FIG. 1.
Figure 3:
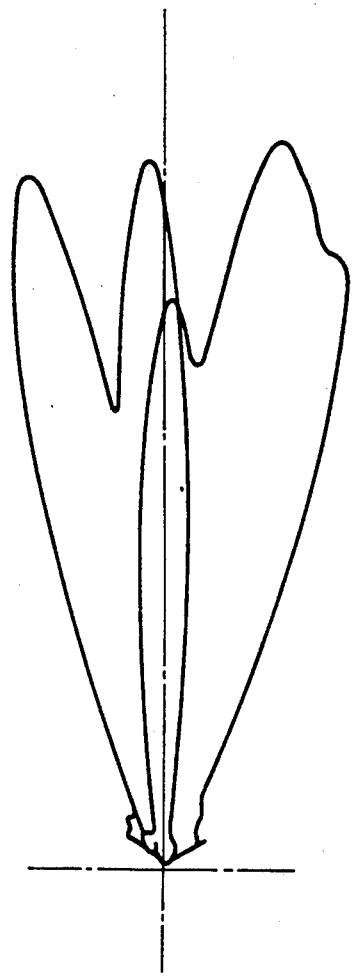
FIG. 3 is a view showing the light distribution characteristic of the LED lamp of FIG. 2.

FIG. 3 shows the light distribution characteristic of the LED lamp of the invention, whereas FIG. 4 shows that of the conventional LED lamp. As is evident from these figures, the light beams emitted from the conventional LED lamp are separated from each other, while those emitted from the invention are overlapped with each other, which means that the light beams are effectively directed to the outside of the lamp.

Figure 5:
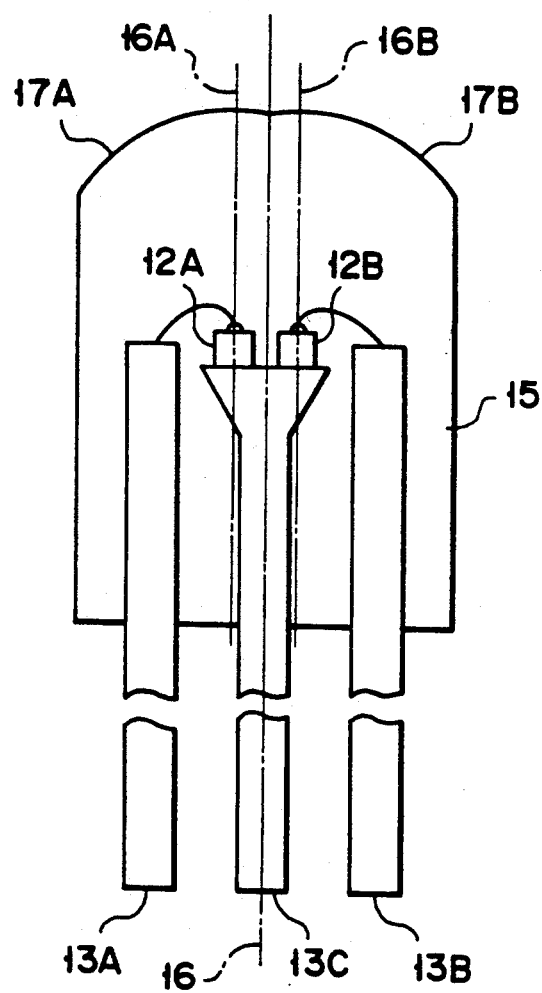
FIGS. 5-7 show variations of the LED lamp of FIG. 2.
Figure 6:
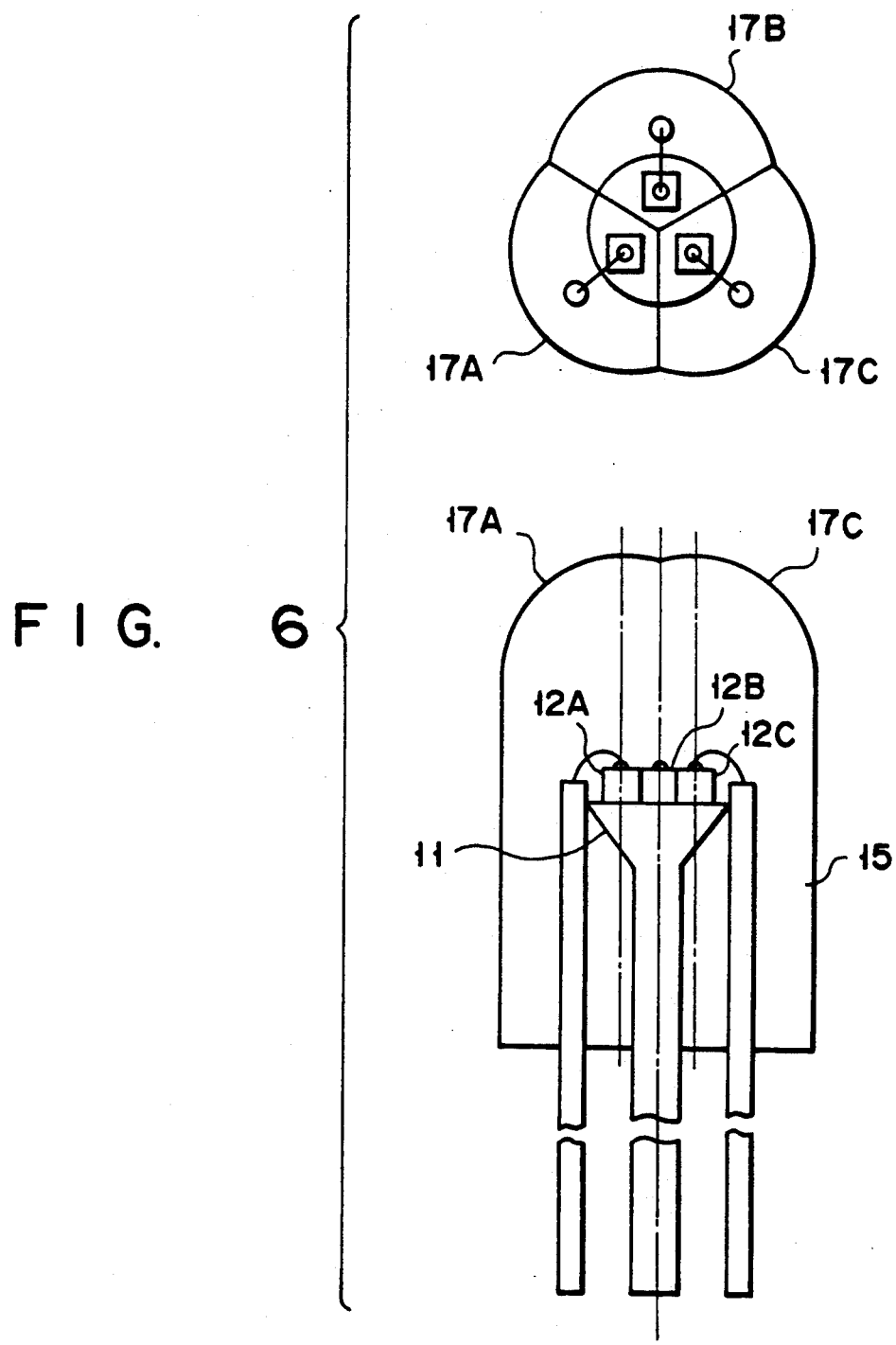
Figure 7:
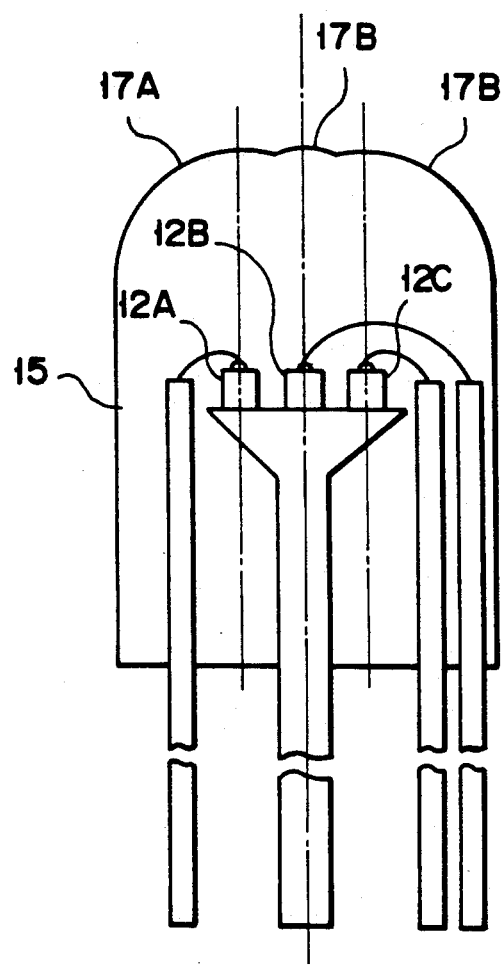

FIGS. 5-7 show variations of the LED lamp of the invention. The lamp of FIG. 5 differs from that of FIG. 2 in that the curved surfaces 17A and 17B are coupled to each other in a manner more smooth than those in FIG. 2. The more smoothly the surfaces 17A and 17B are connected, the more effectively light can be emitted to the outside of the lamp through the surfaces. In the LED lamps shown in FIGS. 6 and 7, three semiconductor chips 12A-12C are placed on the chip-mounting portion 11. The upper portion of each of those lamps differs from that of the lamp in FIG. 2 in that it has three curved surfaces 17A-17C. These surfaces are formed of parts of three spheroids (or spheres).

The LED lamps of FIGS. 5-7 provide an advantage similar to that obtained from the embodiment of FIG. 2.

In a case where a plurality of LED lamps are arranged in a matrix, ununiform light distribution on a plane perpendicular to the axes 16 of the envelopes would adversely affect the embellishment of the entire device.

Here, for ease of understanding, let us assume a coordinate system in which the location of the semiconductor chip 12A (or 12B) is the origin of the x, y, and z coordinate axes, the z axis corresponding to the axis 16A (or 16B) which extends through the chip 12A (or 12B) and is parallel with the lead 13C (i.e., being parallel with the axis 16 of the envelope), the x axis extending through the chips 12A and 12B and being perpendicular to the z axis, and the y axis extending through the origin and being perpendicular to the z and x axes. In this coordinate system, the light is to be emitted from the chips 12A and 12B in the direction of the z axis.

Figure 8:
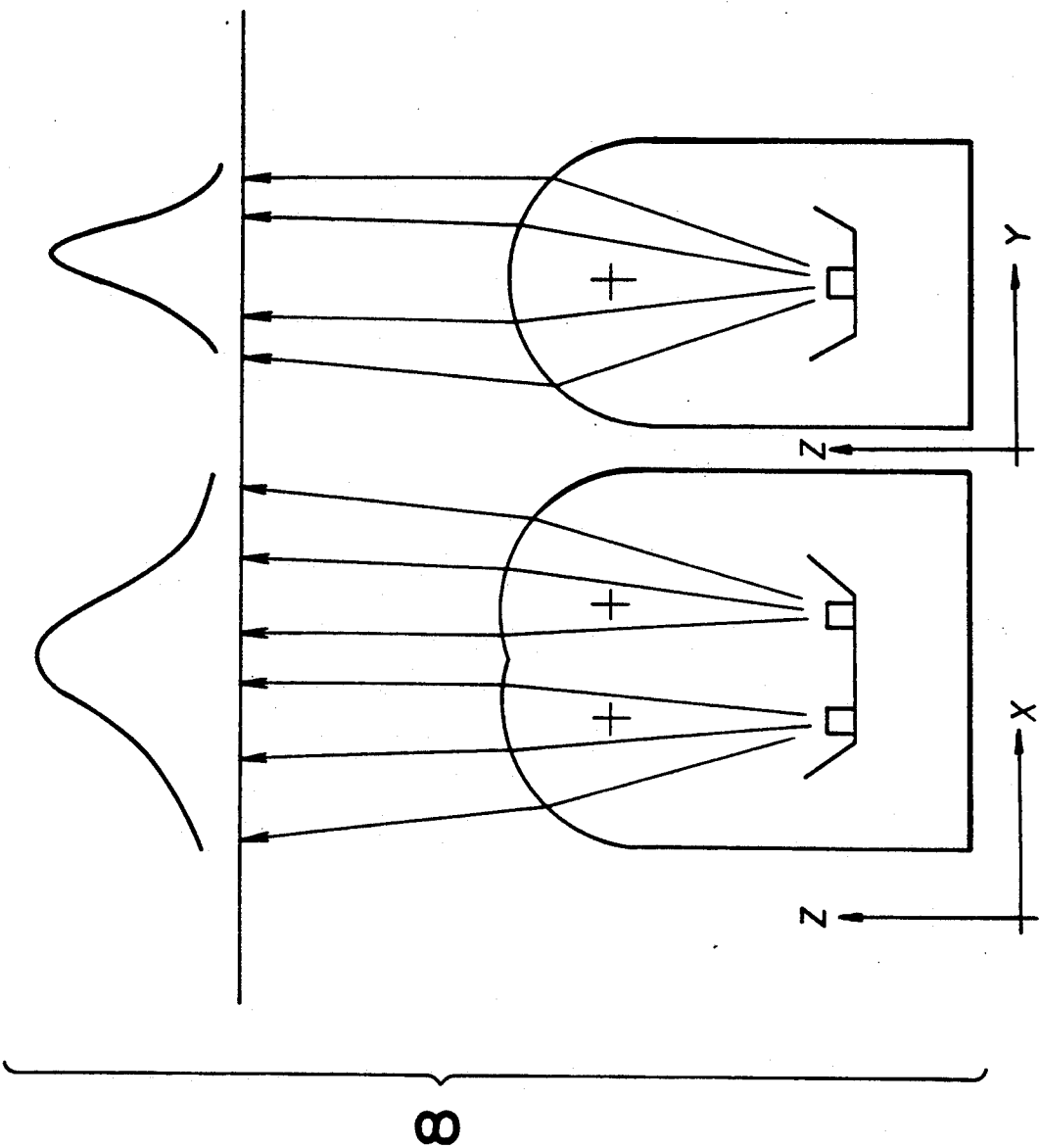
FIG. 8 is a view showing the x-y direction light distribution characteristic of the LED lamp of FIG. 2.
Figure 9:
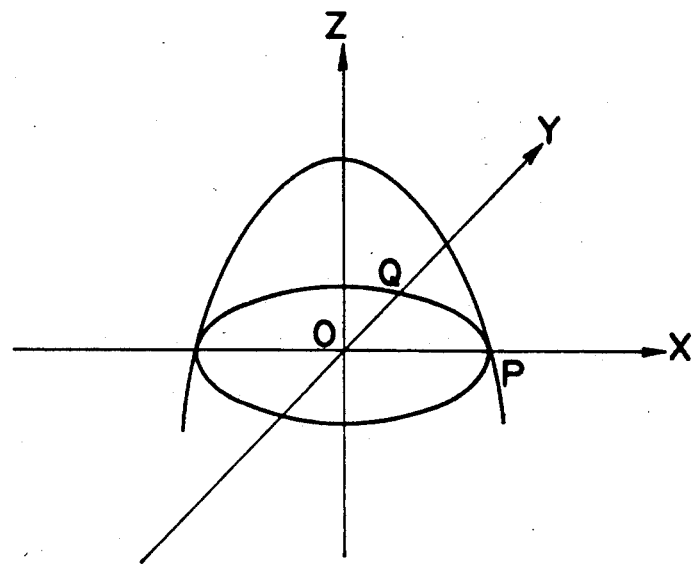
FIG. 9 is a view showing a spheroid forming the lens of the LED lamp of FIG. 2.
Figure 10:
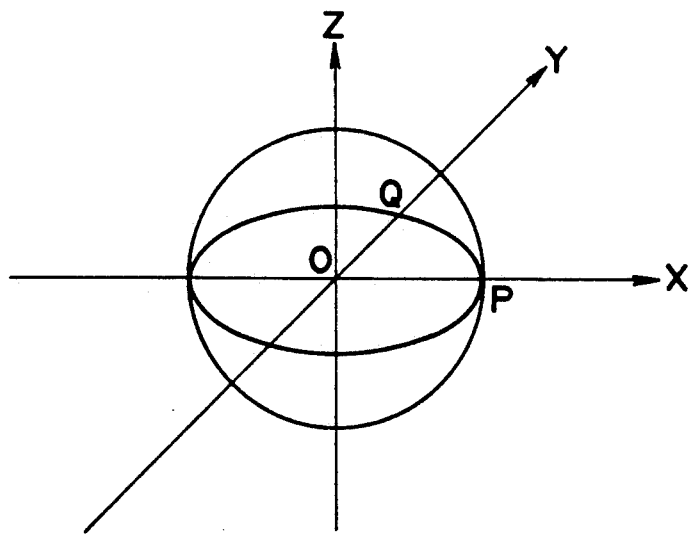
FIG. 10 shows a sphere forming the lens of the LED lamp of FIG. 2.

In the LED lamp of FIG. 2, the light distribution on a plane perpendicular to the axis 16 of the envelope was measured. As is evident from FIG. 8, the light covers a larger area in the direction of the x axis than in the direction of the y axis. This is because the curved surface 17A (or 17B) of the envelope is formed of part of a spheroid (FIG. 9) or sphere (FIG. 10) whose rotational axis is the z axis, in other words, because the curved surface is formed of part of an ellipsoid whose cross section cut along the x-z plane is the same as that cut along the y-z plane.

Figure 11:
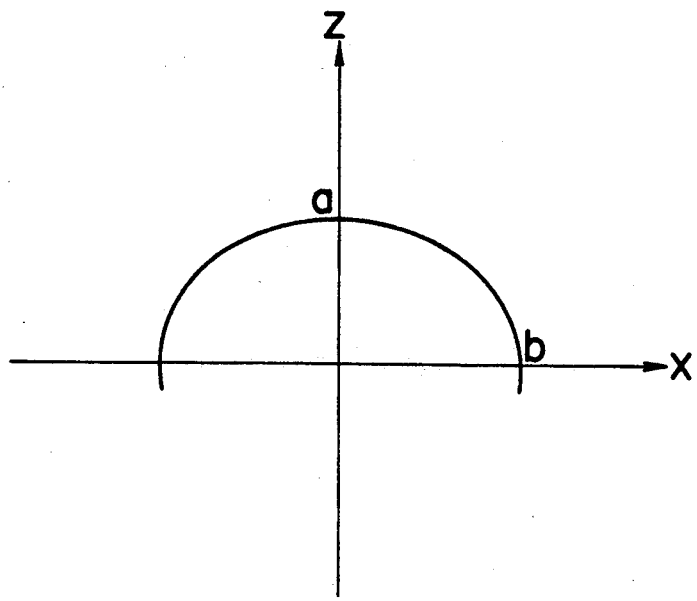
FIGS. 11-12 show curved surfaces which are ellipsoids forming the upper portions of LED lamps according to another embodiment of the invention.
Figure 12:
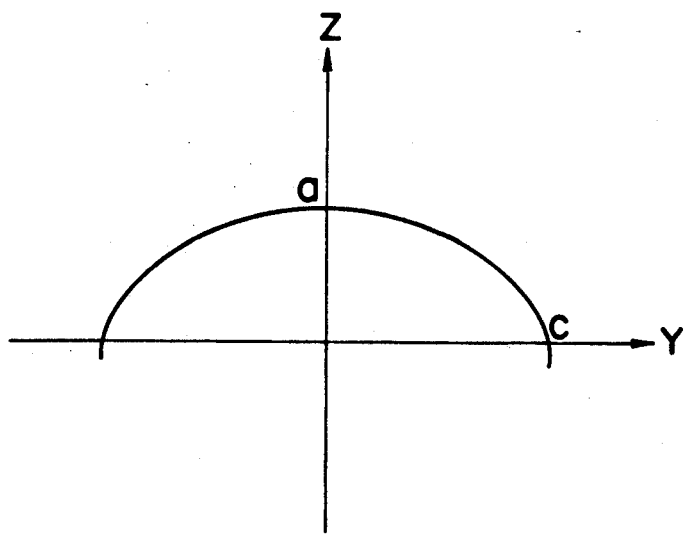

FIGS. 11-12 show LED lamps according to other embodiments of the invention. Though these lamps are similar to the LED lamp shown in FIG. 2 in that they have upper portions each consisting of two curved surfaces, they differ from the latter in that the two curved surfaces are formed of parts of the following bodies.

Each curved surface may be formed of part of an ellipsoid whose axis is the z axis. In this case, as is shown in FIG. 11, the cross section of each curved surface portion which is taken along the x-z plane is an oval having a minor axis of a and a major axis of b. Further, as is shown in FIG. 12, the cross section of each curved surface portion which is taken along the y-z plane is an oval having a minor axis of a and a major axis of c.

According to the embodiments shown in FIGS. 11-12, the light distribution characteristic of the LED lamp in the x-axis direction can be made substantially the same as that in the y-axis direction, by varying the shape of each of the curved surfaces of the envelope in accordance with the number of the semiconductor chips employed.

Figure 13:
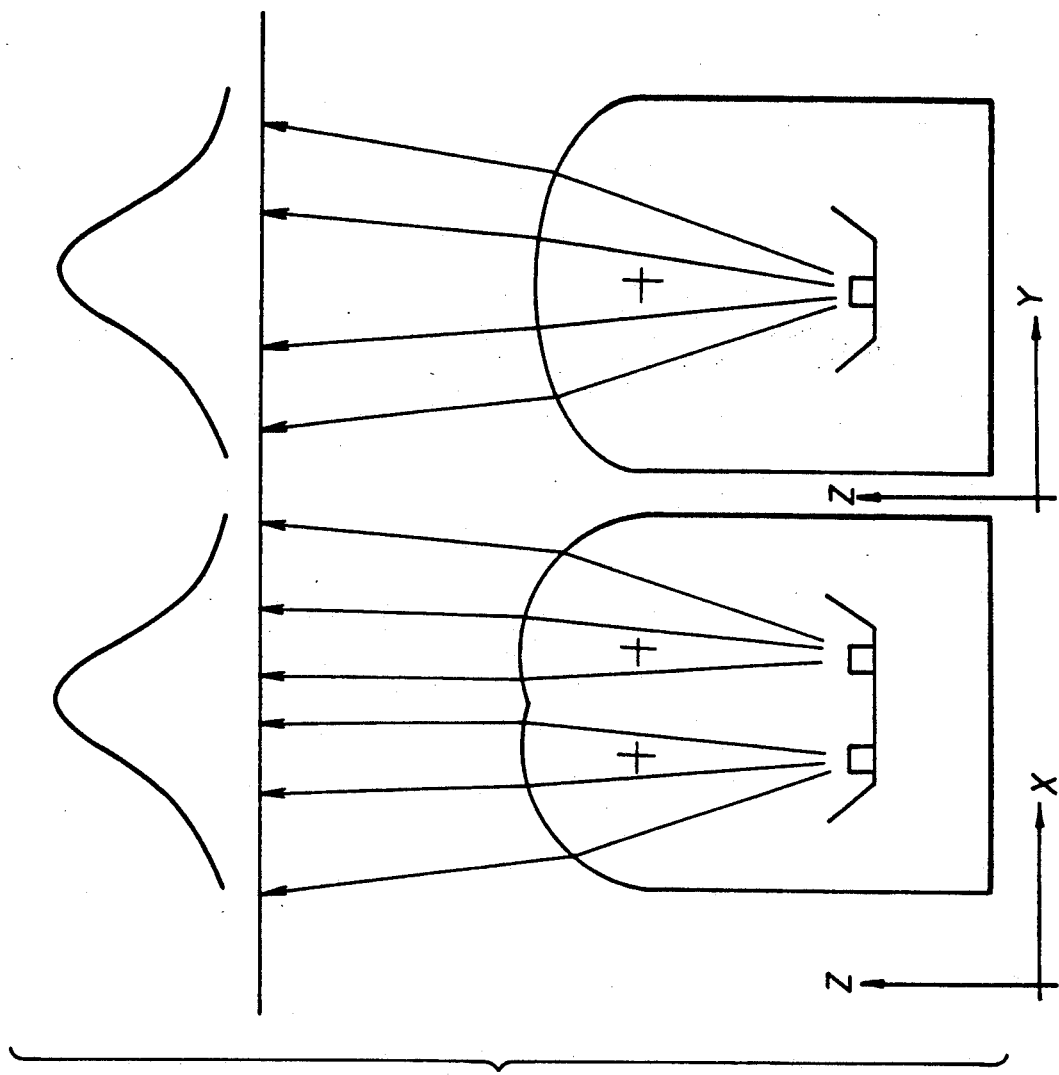
FIG. 13 is a view showing the x-y direction light distribution characteristic of a LED lamp according to a further embodiment of the invention.

FIG. 13 shows that light distribution characteristic of an LED lamp according to a further embodiment of the invention which is obtained in the x-axis and y-axis directions. This LED lamp employs two semiconductor chips, and has an envelope comprising two upper curved surfaces corresponding to the two semiconductor chips, respectively, and each formed of part of an ellipsoid whose axis is one of the x, y, and z axes. This ellipsoid differs from each ellipsoid of FIG. 8 in that its cross section cut along the x-z plane differs from that cut along the y-z plane. That is, as is evident from FIG. 13, the light distribution characteristic in the x-axis direction is substantially the same as that in the y-axis direction, which enables the lamp to emit a fine circular light spot.

Additional advantages and modifications will readily occur to those skilled in the art. Therefore, the invention in its broader aspects is not limited to the specific details, representative devices, and shown and described herein. Accordingly, various modifications may be without departing from the spirit or scope of the general inventive concept as defined by the appended claims and their equivalents.

What is claimed is:

1. An LED lamp including a lead having a tip portion on which first and second semiconductor chips are mounted, and an envelope surrounding the chips;
   wherein
   the envelope has upper and lower portions;
   the lower portion is cylindrical in shape and has an axis extending through the lead; and
   the upper portion is formed of part of a first ellipsoid which has an axis extending through the first semiconductor chip and being parallel with the lead, the first ellipsoid including points which are at different distances from a center of the first ellipsoid, and part of a second ellipsoid which has an axis extending through the second semiconductor chip and being parallel with the lead, the second ellipsoid including points which are at different distances from a center of the second ellipsoid.

2. The LED lamp according to claim 1, wherein the axes of the first ellipsoid and the second ellipsoid are parallel with each other.

3. An LED lamp including a lead having a tip portion of which a plurality of semiconductor chips are mounted, and an envelope surrounding the chips:
   wherein
   the envelope has upper and lower portions;
   the lower portion is cylindrical in shape and has an axis extending through the lead; and
   the upper portion is formed of portions of ellipsoids except spheroids, each ellipsoid has an axis extending through one of the semiconductor chips and each of said axes of said ellipsoids being parallel to the lead.

4. A light emitting diode, comprising:
   an envelope having an upper and a lower portion;
   a plurality of light emitting means contained within said envelope; and
   supply means, extending through the lower portion of said envelope, for supplying energy to the plurality of light emitting means;
   said upper portion of said envelope comprising portions of ellipsoids corresponding to said plurality of light emitting means such that there is a portion of a different ellipsoid corresponding to each of said light emitting means, each of said ellipsoids including points which are at a different distance from a center of one of said ellipsoids corresponding to the points.

5. A light emitting diode according to claim 4, wherein each of said ellipsoids contains an axis extending through the corresponding light emitting means and said axes are parallel to each other.

* * * * *